United States Patent [19]
Yudovsky et al.

[11] Patent Number: 6,040,011
[45] Date of Patent: Mar. 21, 2000

[54] SUBSTRATE SUPPORT MEMBER WITH A PURGE GAS CHANNEL AND PUMPING SYSTEM

[75] Inventors: Joseph Yudovsky; Moris Kori, both of Palo Alto, Calif.

[73] Assignee: Applied Materials, Inc., Santa Clara, Calif.

[21] Appl. No.: 09/103,462

[22] Filed: Jun. 24, 1998

[51] Int. Cl.[7] .............................. C23C 16/06; C23C 16/44
[52] U.S. Cl. .............. 427/255.28; 118/728; 427/255.392
[58] Field of Search ................. 427/255.28, 255.392; 118/500, 728

[56] References Cited

U.S. PATENT DOCUMENTS

| | | |
|---|---|---|
| 5,447,570 | 9/1995 | Schmitz et al. . |
| 5,516,367 | 5/1996 | Lei et al. . |
| 5,556,476 | 9/1996 | Lei et al. . |
| 5,882,417 | 3/1999 | van de Ven et al. ............ 118/728 |

Primary Examiner—Leo B. Tentoni
Attorney, Agent, or Firm—Thomason, Moser & Patterson

[57] ABSTRACT

The present invention discloses susceptor used in vacuum CVD chambers which provides a purge gas delivery and removal system that inhibits the deposition of process gas on the edge and back side of a substrate, while providing access to the entire surface of the substrate for processing. The susceptor has a substrate receiving surface having a perimeter. A purge gas such as argon is passed over the perimeter of the surface using a purge gas system having an inlet disposed adjacent to the substrate receiving surface. The purge gas is removed by a pump system having an outlet disposed adjacent to the substrate receiving surface.

38 Claims, 4 Drawing Sheets

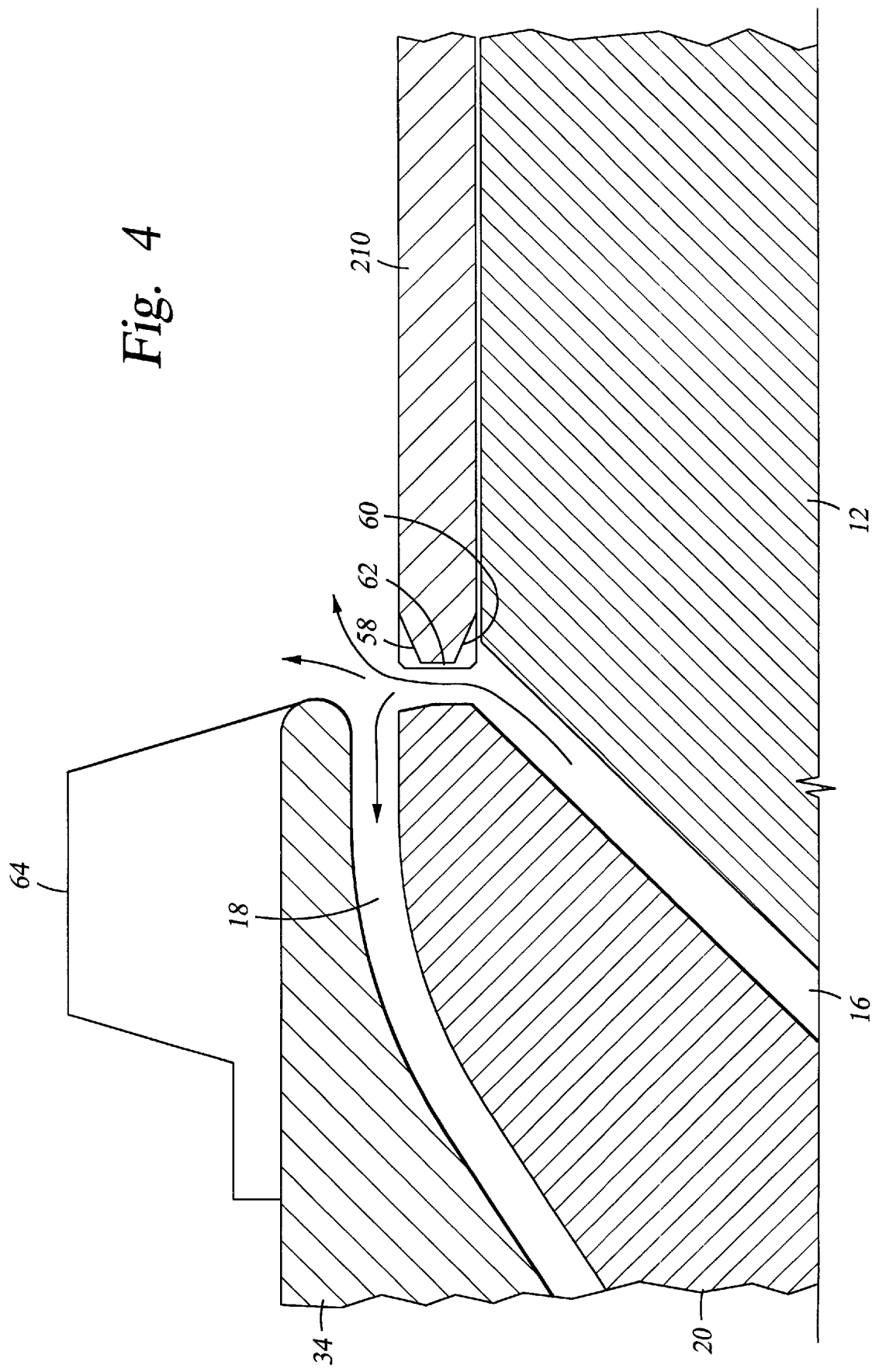

SUBSTRATE SUPPORT MEMBER WITH A PURGE GAS CHANNEL AND PUMPING SYSTEM

BACKGROUND OF THE INVENTION

1. Field of the Invention

The present invention relates to an improved susceptor. More particularly, the invention relates to a susceptor which inhibits the deposition of process gases on the edge and back side of a substrate.

2. Background of the Related Art

Chemical vapor deposition (CVD) is one of a number of processes used to deposit thin films of material on semiconductor substrates. To process substrates using CVD, a vacuum chamber is provided with a susceptor configured to receive a substrate. In a typical CVD chamber, the substrate is placed into and removed from the chamber by a robot blade and is supported by the susceptor during processing. A precursor gas is charged to the vacuum chamber through a gas manifold plate situated above the substrate, where the substrate is heated to process temperatures, generally in the range of about 250°–650° C. The precursor gas reacts on the heated substrate surface to deposit a thin layer thereon and to form volatile by-product gases, which are pumped away through the chamber exhaust system.

A primary goal of substrate processing is to obtain the largest useful surface area possible from each substrate. This is highlighted by the recent demands from semiconductor chip manufacturers for zero edge exclusion on the substrates processed. Some important factors to consider include processing variables that effect the uniformity and thickness of the layer deposited on the substrate and contaminants that can attach to the substrate and render all or a portion of the substrate useless. Both of these factors should be controlled to maximize the useful surface area for each substrate processed.

One cause of particulate contamination in the chamber is deposition of material at the edge or on the backside of the substrate. Substrate edges are typically beveled, making deposition difficult to control over these surfaces, thus deposition at substrate edges can be non-uniform. This may lead to deposited layers that do not adhere properly to the substrate edge and eventually chip or flake off, causing unwanted particle generation in the chamber.

Additionally, chemical mechanical polishing is often used to smooth the surface of a substrate coated with tungsten or other metals. The act of polishing will cause any deposits on the edge and backside surfaces to flake off and generate unwanted particles.

Thus, different approaches have been employed to control the deposition of process gases on the edge of a substrate during processing. One approach employs a shadow ring that essentially masks a portion of the perimeter of the substrate from the process gases. This reduces the overall useful surface area of the substrate and in light of the current demand from chip manufacturers for zero edge exclusion, this method is becoming impractical.

Another approach employs a gas manifold near the edge of the substrate for the delivery of purge gas past the edge to prevent edge deposition on the substrate as shown in U.S. Pat. No. 5,556,476 to Lei et al. The purge gas inhibits the deposition of process gases at the substrate edge, but the purge gas also mixes with the process gas and is typically exhausted through the same manifold as the process gas. This mixing can lead to dilution of the process gas and/or non-uniform deposition of the gases on the substrate surface.

A third approach uses a shadow ring and a purge gas channel in combination to form a purge gas chamber adjacent to the substrate edge having a purge gas inlet and outlet. This system requires a higher pressure within the purge gas chamber than in the process chamber to keep the process gas from being drawn into the purge gas outlet. Therefore, the purge gas is drawn into the chamber and out through the processing chamber exhaust system. Drawing the purge gas into the exhaust system of the process chamber can have a negative effect on the process uniformity over the substrate surface.

Therefore, there is a need for a device that allows for full surface coverage of a substrate which prevents backside and edge deposition without disrupting the uniformity of the process gases and the resulting uniformity of the film formed on the substrate.

SUMMARY OF THE INVENTION

The present invention generally discloses a susceptor, used in vacuum CVD chambers for deposition of tungsten, tungsten silicide, titanium nitride, aluminum, copper and like metals, which provides a purge gas delivery and removal system that prevents the edge and backside deposition of process gases, while providing minimum disruption of process gas deposition on the substrate surface.

One embodiment of the invention provides a susceptor for use in a chamber, such as a CVD chamber, that prevents the edge and backside deposition on substrates while providing access to the entire surface of the substrate for processing. The susceptor has a substrate receiving surface positioned in the bottom of a pocket formed by the susceptor and an outer tapered shoulder. A purge gas such as argon is passed over the perimeter of the surface using a purge gas system having an inlet disposed adjacent to the substrate receiving surface. The purge gas is removed by a pump system having an outlet disposed adjacent to the substrate receiving surface. The susceptor can have a resistive heater mounted therein to eliminate the need for external heating sources in a processing chamber. This purge/pump approach provides a controllable flow of purge gas past the edge of a substrate without negatively effecting process uniformity over the surface of the substrate.

A method for depositing a coating on a substrate is also disclosed. A substrate support member having a substrate receiving surface thereon, such as a susceptor, is provided. A substrate is positioned on the substrate receiving surface, preferably so that the edge of the substrate is in alignment with the a purge gas channel. A purge gas flows through the purge gas channel past the substrate edge to prevent process gas from depositing on the edge of the substrate. The pump channel inlet is preferably disposed outwardly and above the purge gas channel outlet to ensure that the purge gas flows past the edge of the substrate and out of the chamber through the pump channel. The purge gas is removed from the chamber through a pump channel having an outlet disposed adjacent to the edge of the substrate and above the purge gas channel. The flow rate of the purge and pump systems may be manipulated to optimize the prevention of deposition on the edge of the substrate and minimize the area potentially disturbed by the purge gas.

The susceptor described above can also be used in a system or apparatus for depositing a film on a substrate where it is desirable to inhibit back side and edge deposition of the film on the substrate. The system includes a processing chamber and a susceptor having a surface for receiving a substrate thereon disposed in the chamber, a purge gas system, and a pump system. The purge gas system includes an outlet disposed adjacent to the perimeter of the surface for flowing purge gas past the perimeter. A pump system having an inlet is disposed adjacent to the surface for removing purge gas from the chamber and a vacuum exhaust system for removing gases from the chamber is also provided.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments. In the Figures, like parts are numbered the same in each drawing.

FIG. 4 is a cross-sectional view of a susceptor of the present invention.

DETAILED DESCRIPTION OF THE PREFERRED EMBODIMENT

Figure 1:
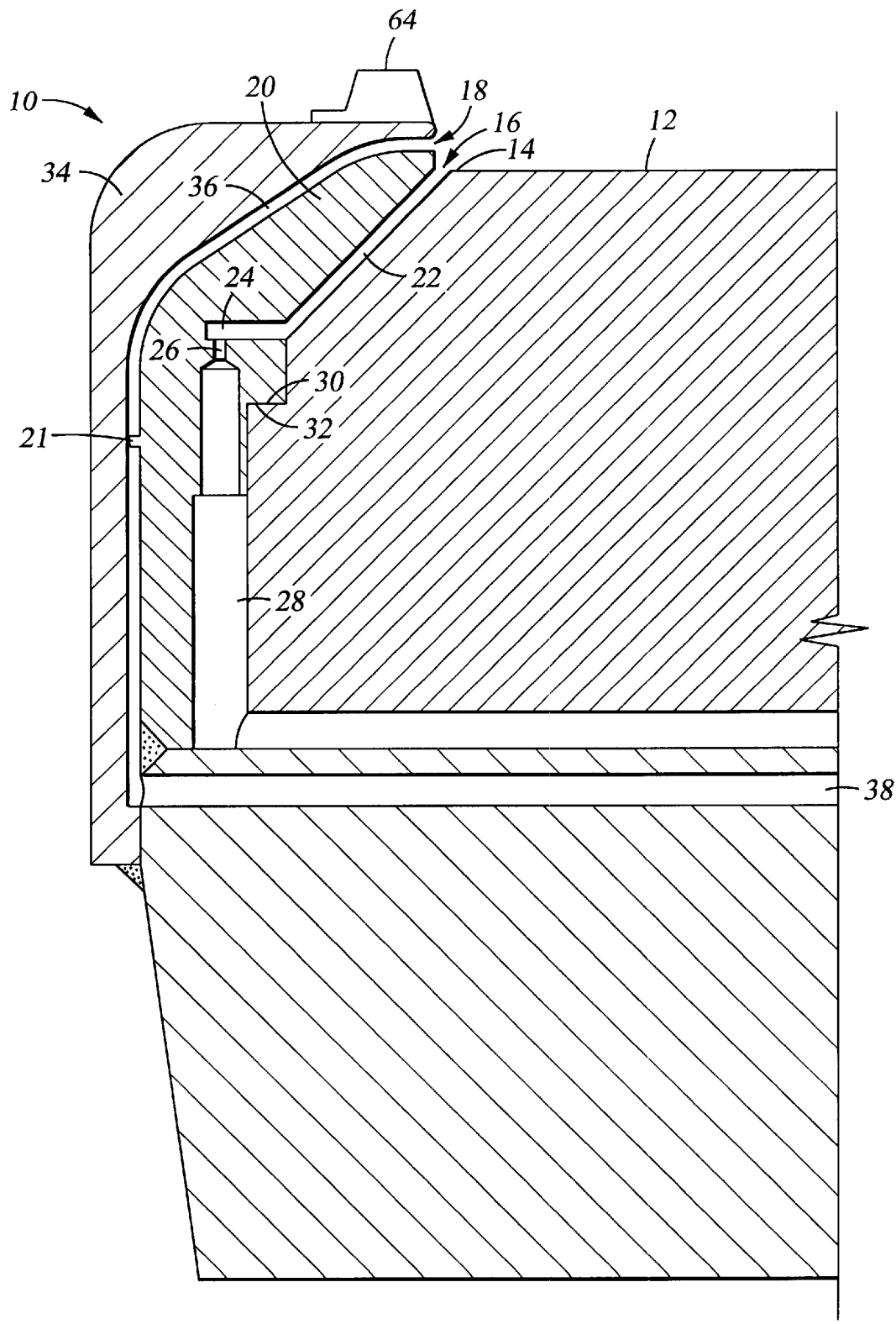
FIG. 1 is a cross sectional, view of a susceptor of the present invention.

The present invention generally provides a susceptor used in integrated circuit and flat panel display production which provides a purge gas delivery and removal system that inhibits the deposition of process gas on the edge and back side of a substrate. FIG. 1, is a cross sectional, view of a susceptor showing one embodiment of a substrate support member, referred to herein as a susceptor 10, for supporting a substrate in a processing chamber such as a CVD chamber. The susceptor 10 includes a substrate receiving surface 12 that is generally flat and is defined at its perimeter 14 by a purge gas channel 16. The substrate receiving surface is disposed at the bottom of a pocket 11 defined by an outer tapered shoulder 13. A purge gas such as argon is passed over the perimeter 14 of the surface 12 using a purge gas system having an inlet 16 disposed adjacent to the substrate receiving surface 12. An pump outlet 18 for exhausting the purge gas is disposed in the shoulder outwardly from the substrate receiving surface 12. Preferably, the outlet 18 is located above the level of the substrate receiving surface 12 to provide a purge gas flow past the edge of a substrate. Optionally, the susceptor 10 can have a resistive heater mounted therein to eliminate the need for external heating sources in a processing chamber.

The purge gas system may include a purge gas ring 20 mounted on the susceptor 10 and a purge gas channel 22 formed between the purge gas ring 20 and the susceptor 10, for delivering a purge gas to the surface 12. Preferably, the purge gas channel 22 is angled toward the substrate receiving surface 12 at an angle of approximately 45 degrees so that the purge gas flow is directed to the perimeter 14 of the surface 12. It should be understood that the susceptor described herein may be of any shape to accommodate a specific substrate so that the purge gas inlet 16 is positioned adjacent to the edge of the substrate.

The flow rate of the purge and pump systems may be manipulated to optimize the prevention of deposition on the edge of the substrate and minimize the area potentially disturbed by the purge gas. The flow rate of the purge gas and the pump channel may be between 300–1500 sccm, preferably, from about 500–800 sccm when depositing a process gas at about 75–100 sccm in conjunction with a carrier gas, such as argon, at about 500–1200 sscm. These flow rates may be varied depending on the flow rate of the process gas, the carrier gas, the desired edge exclusion, and the acceptable levels of uniformity of deposition. For example, a lower process gas flow rate will give a smaller area of deposition on the substrate and a lower purge/pump flow rate may be adequate or the purge/pump flow rate may be increased if the process gas uniformity near the edge of the substrate is not an issue. It is preferred that the flow rate for the purge gas exceed that of the pump channel to prevent the process gas from flowing into the pump channel. More preferably, the purge gas flow shall inhibit all deposition of process gas on the beveled edge of the substrate while providing minimum interference with the process gas deposition near the top edge of the substrate. The higher the purge gas flow rate, the cleaner the edge of the substrate will be. Preferably, the pumping rate should follow the purge gas flow rate in order to compensate for distortion of the process gas flow caused by the high rate of purge gas flow at the edge of the substrate.

In the event the process gas is drawn into the pump channel, routine cleaning of the chamber and susceptor will remove any deposits in the channel. One method of cleaning the pump channel may include shutting off the process gas exhaust, injecting a cleaning gas such as $NF_3$ and allowing the cleaning gas to enter the pump channel to remove any deposited process gas. The exhaust can then be turned on and the pump channel turned off so that all the cleaning gas is removed from the chamber.

Figure 2:
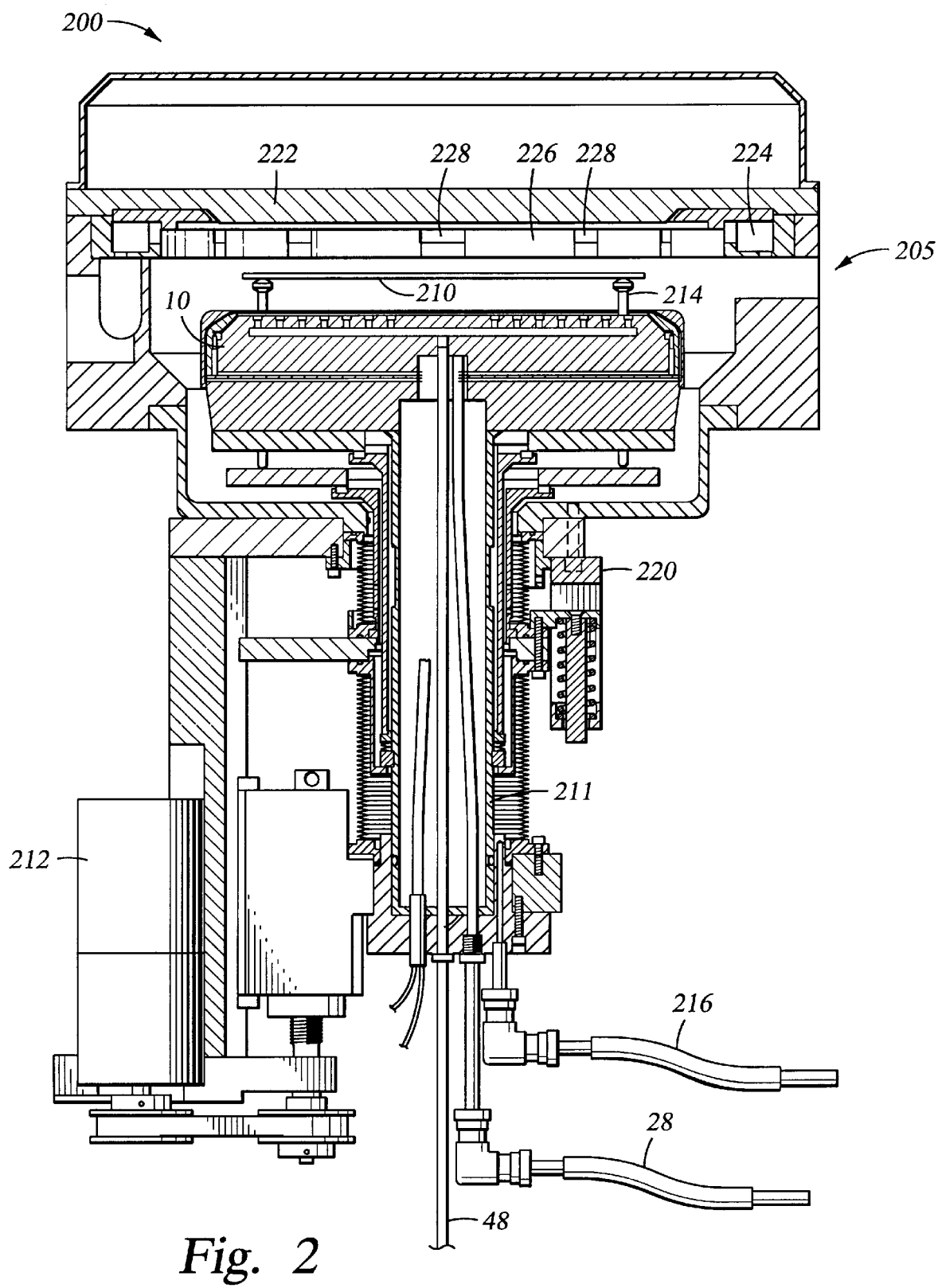
FIG. 2 is a partial cross-sectional view of a processing chamber having a susceptor disposed therein.

An annular gas manifold 24 may be disposed in the purge gas ring 20 with a plurality of ports 26 in communication with the purge gas channel 22 for delivering a purge gas to the channel. The purge gas can be delivered into the manifold 24 through one or more conduits, preferably conduit 28. The purge gas then flows from the multiple ports 26 to the manifold 24 and into the purge gas channel 22, and from the purge gas channel 22 to the inlet 16. Although not shown, conduit 28 connects to purge gas channel 22 in the same manner as conduit 38 as shown in FIG. 2.

The purge gas ring 20 preferably forms an annular shoulder 30 facing away from the substrate receiving surface 12, and the susceptor 10 forms an annular shoulder 32 facing toward the substrate receiving surface 12 that is closely received by the annular shoulder 30 formed by the purge gas ring 20. The purge gas ring 20 can be welded to the susceptor 10 near the lower end of the ring opposite the purge gas inlet 16. Additionally, the conduit 28 is positioned at spaced points around the purge gas ring, so that the purge gas ring abuts the susceptor in areas between the conduit, providing additional support between the purge gas ring and the susceptor.

The pump system may include a pump ring 34 mounted on the susceptor 10 adjacent to the purge gas ring 20, preferably surrounding the purge gas ring 20, so that a pump channel 36 is formed between the purge gas ring 20 and the pump ring 34. The pump system outlet 18 is disposed outwardly and above the purge gas system inlet 16 to increase the efficient removal of the purge gas without disturbing the process in the chamber. The pump system outlet 18 is in communication with the pump channel 36 and the pump channel 36 communicates with a conduit 38 connected to a pump or vacuum source (not shown) for removing the purge gas. The pump ring 34 is also welded to the susceptor 10 near the end opposite the pump inlet. In addition, the purge gas ring can have spacers 21 extending from the perimeter of the purge gas ring to contact the pump ring 34 to keep the pump channel open and provide additional stability. Preferably, the spacers are positioned equidistant from one another, any number of spacers can be used with the present invention.

Preferably, the shoulder 13 is at least as high as any substrate placed on the substrate receiving surface for processing. It is preferred that the purge gas inlet 16 be positioned at or near the edge of the substrate so that the purge gas will pass by the edge and prevent deposition on the edge and backside of the substrate. Likewise, it is preferred that the pump outlet 18 be at least as high as the processing surface of a substrate in order to remove the purge gas effectively with minimal disturbance of the process gases inside the chamber. Preferably, the pump outlet 18 is positioned substantially parallel to the plane defined by the substrate support member so that the outlet 18 opens into the chamber at a position just above the processing surface of a substrate being processed.

A method for depositing a coating on a substrate is also disclosed. A substrate support member having a substrate receiving surface thereon, such as a susceptor, is provided. A substrate is positioned on the substrate receiving surface, in such a manner that the edge of the substrate is in alignment with the purge gas channel. Alignment pins may be used to align the susceptor with the substrate receiving surface. A purge gas flows through the purge gas channel past the substrate edge to prevent process gas from depositing on the edge of the substrate. The pump channel outlet is preferably disposed outwardly and above the purge gas channel inlet to ensure that the purge gas flows past the edge of the substrate and out of the chamber through the pump channel.

As shown in FIG. 2, the susceptor 10 described above can be used in a system or apparatus for depositing a film on a substrate where it is desirable to inhibit back side and edge deposition of the film. The apparatus has a housing or processing chamber 200 and a susceptor 10 disposed in the chamber. A substrate receiving surface 12 is disposed at the bottom of a pocket 11 defined by an outer tapered shoulder 13. Purge gas is delivered to the perimeter of the substrate receiving surface through a purge gas system having an inlet 16 disposed in the shoulder 13 adjacent to the substrate receiving surface 12. Preferably, the purge gas inlet 16 includes a purge gas channel 22 formed in the susceptor 10 that extends about the perimeter 14 of the substrate receiving surface 12. The purge gas is preferably delivered to the perimeter of the substrate receiving surface 12 at an angle of approximately 45 degrees relative to the substrate receiving surface 12.

The purge gas is removed from the housing with a pump system having an outlet 18 disposed between the susceptor 10 and the housing 200. Preferably, the pump channel outlet 18 is positioned either at or just above the substrate receiving surface. The pump system outlet 18 includes a channel 36 that can be formed between the susceptor 10 and the housing 200 when the susceptor is in position to begin processing within the housing. The pump system outlet 18 is preferably positioned outwardly and above the perimeter of the substrate receiving surface 12 to exhaust gas radially away from the substrate receiving surface.

Generally, purge gases are inert gases such as argon. However, a small amount of a reactive gas such as hydrogen can be added to the purge gas to enhance deposition of tungsten or other process gases at the edge of the substrate. Reactive gases, such as hydrogen, react with, $WF_6$, to increase the dissociation of $WF_6$ and increase the amount of deposit on the surface of the substrate near the edge thus overcoming the non-uniformity of deposition on the substrate.

Figure 3:
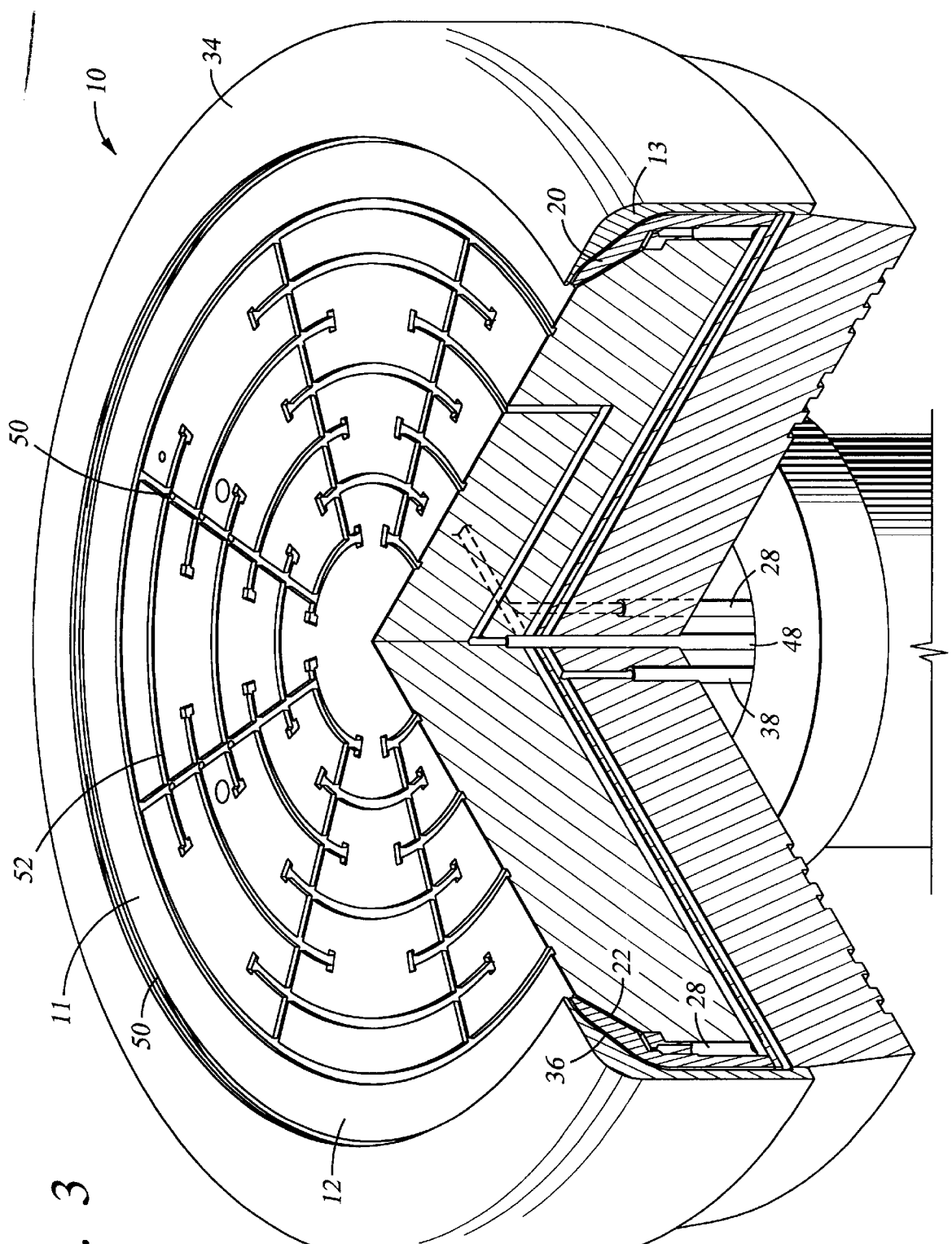
FIG. 3 is a top perspective view of the susceptor.

Referring now to FIGS. 2 and 3, the susceptor 10 preferably includes a vacuum chuck to hold the substrate on the surface 12. One example of a vacuum chuck for use in the present invention is disclosed in U.S. Pat. No. 5,556,476 to Lei et al. incorporated by reference herein. The vacuum line 48 is connected to a source of vacuum (not shown) which is separate from the vacuum exhaust pump for the CVD chamber itself. The vacuum line 48 is connected to a plurality of openings 50 in the surface 12 of the susceptor 10. These openings 50 in turn are located within small channels 52 in the surface 12 of the susceptor 10. For illustration purposes, one opening 50 connected to vacuum line 48 is shown in FIG. 2. When the vacuum is turned on, a substrate mounted onto the susceptor 10 is drawn down against the surface 12 uniformly. The vacuum openings 50 are connected to the channels 52 and are located appropriately to evenly distribute vacuum across the surface 12 of the susceptor 10. The vacuum channels 52 do not extend to the edge of the substrate, but, for example, may extend across the susceptor 10 for about 7 inches when an 8 inch substrate is to be processed.

The pressure of the vacuum line 48 can be from about 1.5 Torr to about 60 Torr when the pressure of the chamber is about 80 Torr. The pressure in the vacuum feed line can be further adjusted by injecting an inert gas, such as argon, to adjust the center to edge uniformity of deposition onto the substrate. For example, increasing the pressure in the vacuum line 48 from about 2.5 Torr to about 10 Torr increases the heat transfer within the heater region and increases the film thickness and uniformity of the deposited film. Shallow grooves may be added to the region outside the vacuum chuck area to reduce heat transfer near the edge of the substrate, which then reduces the thickness of the film being deposited at the edge of the substrate.

FIG. 2 is a partial cross sectional view, of the CVD chamber 200 of the present invention. The substrate 210 is brought into the chamber 200 of the invention by a robot blade (not shown) through a slit valve opening 205 in a sidewall of the chamber. The chamber 200 may be part of a vacuum processing system having a plurality of processing chambers connected to a central transfer chamber. The susceptor 10 is moveable vertically by means of a stem 211 which is connected to a motor 212. The substrate 210 is brought into the chamber when the susceptor 10 is in a first position below the slit valve opening 205. The substrate 210 is supported initially by a set of pins 218 that pass through the susceptor 10 and are coupled to the susceptor 10 driven by a single motor assembly. A second purge line 216 can be added to protect the stainless steel bellows 218 from damage from corrosive gases. However, as the pins 218 rise along with the susceptor 10, they encounter a stop 220. As the susceptor 10 continues to rise to the processing position opposite the processing gas plate 222, the pins 218 sink into the susceptor 10 and the substrate 210 is deposited onto the susceptor 10. The susceptor vacuum supply line 48 is turned on, which affixes the substrate 210 to the susceptor 10. The susceptor 10 is then moved upwardly towards the processing gas plate 222 for processing the substrate 210. When the susceptor 10 and the substrate 210 affixed thereto reach the processing position, the processing gas is turned on and deposition of tungsten or other film is begun. Spent process gases and by-product gases are exhausted by means of the exhaust system 224 from the chamber.

One type of vacuum exhaust system 224 that may be used in the CVD chamber 200 is provided as shown and described in the disclosure of U.S. Pat. No. 5,516,367 to Lei et al, incorporated herein by reference. The exhaust gases are distributed more uniformly by the pumping plate 226 and gases are more evenly evacuated from the periphery of the substrate 210. The pumping plate 226 is mounted in the chamber sidewalls at about the position of the substrate 210 when it is in its processing position. Thus the exhaust gases pass into equally spaced vertical openings 228 into a single channel 250 about the whole periphery of the substrate 210 during processing, and thus exhaust gases pass into the exhaust system 224 in a more uniformly.

When deposition is complete, the processing gas source is turned off, and the susceptor 10 is lowered again. As the susceptor 10 approaches the position at which the lift pins 218 will again protrude from the susceptor 10, the vacuum source connected to vacuum line 48 is turned off so that the processed substrate can be lifted by the pins 218 above the surface 12 of the heater plate 214. The susceptor 10 and the substrate 210 are lowered to their initial position opposite the slit valve, so that the substrate 210 can be removed from the chamber.

FIG. 4 is a cross-sectional view of the susceptor 10 and the purge gas inlet 16 and outlet 18 of the present invention. The substrate 210 has a beveled circumferential edge which includes an upper tapered surface 58, a lower tapered surface 60, and a generally flat middle portion 62. In order to limit the occurrence of defects caused by the dislodging of deposits on the edge and backside of the substrate 210, the deposition layer should be evenly deposited all the way to the edge of the substrate but excluding the upper tapered surface 58, the lower tapered surface 60, the flat middle portion 62, and backside of the substrate. In order to achieve an evenly deposited layer, the purge gas is directed toward the edge of the substrate through inlet 16 and removed from the chamber through outlet 18. The inlet 16 and outlet 18 are positioned so that most of the purge gas is introduced at the edge of the substrate and exhausted out through the outlet 18. The purge gas provides a positive pressure at the edge of the substrate, thereby reducing the likelihood that process gases will contact the edge and deposit thereon.

The normal flow pattern of the process gas is radially outward from the center of the substrate in a direction relatively parallel to the substrate surface and over the shoulder 13, which will tend to direct a portion of the purge gas coming out of the inlet 16 toward the outlet 18 and is drawn out of the chamber. A portion of the purge gas may also mix with the process gas near the edge of the substrate and exit through the main chamber exhaust. The flow pattern of the purge gas is encouraged by a higher pressure in the purge channel than in the chamber. Thus, the purge gas is drawn into the chamber by the pressure difference and pulled out of the chamber by the flow of the process gas and the pressure drop within the pump outlet 18 and channel.

Preferably, the purge gas and pump channel form a taper so that when the substrate is positioned on the substrate receiving surface, the substrate will be aligned properly. However, the susceptor 10 may be equipped with an alignment system to align the substrate as it is lowered onto the substrate receiving surface 12. The alignment system includes a plurality of alignment protrusions 64 disposed on the substrate support member to align a substrate received on the substrate support member within the pocket as described in U.S. Pat. No. 5,556,476 to Lei et al.

While foregoing is directed to the preferred embodiment of the present invention, other and further embodiments of the invention may be devised without departing from the basic scope thereof, and the scope thereof is determined by the claims that follow.

What is claimed is:

1. An apparatus comprising:
   a substrate support member;
   a pocket defined by the substrate support member having a substrate receiving surface thereon and a shoulder, wherein said substrate receiving surface has a perimeter;
   a purge gas system having an inlet disposed in the shoulder, adjacent to the substrate receiving surface;
   a pump system having an outlet disposed in the shoulder of the pocket.

2. The apparatus of claim 1, wherein the purge gas inlet includes a purge gas channel formed in the substrate support member, the channel extending about the perimeter of the substrate receiving surface.

3. The apparatus of claim 1, wherein the purge gas inlet is formed at the intersection between the shoulder and the substrate receiving surface of the pocket.

4. The apparatus of claim 1 wherein the pump outlet includes a pump channel formed in the shoulder of the pocket.

5. The apparatus of claim 1, wherein the pump system outlet is disposed outwardly and above the purge gas system inlet.

6. The apparatus of claim 1, wherein the shoulder is arranged generally perpendicular to the substrate receiving surface.

7. The apparatus of claim 1, further comprising a substrate alignment system.

8. The apparatus of claim 1, wherein the alignment system includes a plurality of alignment protrusions disposed on the substrate support member to align a substrate received on the substrate support member within the pocket.

9. The apparatus of claim 1, wherein the purge gas system is capable of delivering gas to the perimeter of the substrate receiving surface at a rate of from about 300 to about 1500 sccm.

10. The apparatus of claim 1, wherein the pump system has a flow rate of from about 300 to about 1500 sccm.

11. The apparatus of claim 1, wherein the purge gas system includes a purge gas ring mounted on the substrate support member, and a purge gas channel formed between the purge gas ring and the substrate support member.

12. The apparatus of claim 11, wherein the pump system includes a pump ring mounted on the substrate support member adjacent to the purge gas ring, and a pump channel formed between the purge gas ring.

13. The apparatus of claim 11, wherein the purge gas ring has an annular shoulder facing away from the substrate receiving surface, and the substrate support member has an annular shoulder facing toward the substrate receiving surface, that is sized to closely receive the shoulder on the purge gas ring.

14. An apparatus comprising:
    a housing;
    a substrate support member disposed within the housing;
    a pocket defined by the substrate support member having a substrate receiving surface therein and a shoulder, wherein said substrate receiving surface has a perimeter;

a purge gas system having an inlet disposed in the shoulder, adjacent to the substrate receiving surface; and a pump system having an outlet disposed between the substrate support member and the housing.

15. The apparatus of claim 14, wherein the purge gas inlet includes a purge gas channel formed in the substrate support member, wherein the channel extends about the perimeter of the substrate receiving surface.

16. The apparatus of claim 14, wherein the pump system outlet includes a channel formed between the substrate support member and the housing.

17. The apparatus of claim 14, wherein the pump system outlet is positioned outwardly and above the perimeter of the substrate receiving surface to exhaust gas radially away from the substrate receiving surface.

18. The apparatus of claim 14, wherein the purge gas system delivers purge gas to the perimeter of the substrate receiving surface at an angle of approximately 45 degrees relative to the substrate receiving surface.

19. The apparatus of claim 14, further comprising a substrate alignment system.

20. The apparatus of claim 19, wherein the alignment system includes a plurality of alignment protrusions disposed on the substrate support member to align a substrate received on the substrate support member within the pocket.

21. A method for depositing a coating on a substrate comprising:
   positioning a substrate on a substrate receiving surface of a substrate support member;
   flowing a process gas into the chamber and to the substrate;
   flowing a purge gas through a purge gas inlet disposed at least partially around the edge of the substrate receiving surface;
   exhausting the purge gas from the chamber through a pump channel formed in the substrate support member and having an outlet disposed adjacent to the edge of the substrate and above the purge gas inlet.

22. The method of claim 21, wherein the substrate receiving surface is positioned on the floor of a pocket defined by the substrate support member and a shoulder.

23. The method of claim 21, further comprising, aligning the edge of the substrate with the purge gas outlet, so that the edge of the substrate is positioned in the flow path of the purge gas outlet.

24. The method of claim 21, wherein the pump outlet is positioned outwardly above the substrate.

25. The method of claim 21, wherein the process gas comprises tungsten.

26. An apparatus comprising:
   a substrate processing chamber, having a process gas supply;
   a substrate support member disposed within the chamber;
   a pocket defined by the substrate support member having a substrate receiving surface therein and a shoulder, wherein said substrate receiving surface has a perimeter;
   a purge gas system having an inlet disposed in the shoulder, adjacent to the substrate receiving surface; and
   a pump system having an outlet disposed between the substrate support member and the chamber.

27. The apparatus of claim 26, wherein the process gas supply comprises tungsten.

28. The apparatus of claim 26, wherein the purge gas inlet includes a purge gas channel formed in the substrate support member, wherein the channel extends about the perimeter of the substrate receiving surface.

29. The apparatus of claim 26, wherein the pump system outlet includes a channel formed between the substrate support member and the housing.

30. The apparatus of claim 26, wherein the pump system outlet is positioned outwardly and above the perimeter of the substrate receiving surface to exhaust gas radially away from the substrate receiving surface.

31. A processing apparatus, comprising:
   an enclosure;
   a substrate support member disposed at least partially in the enclosure and having a substrate receiving surface thereon;
   a purge gas system having an inlet disposed at least partially around the substrate receiving surface; and
   a purge gas pump system having an outlet disposed adjacent to the purge gas inlet, wherein an edge of the substrate is at least partially disposed adjacent to the inlet and the outlet.

32. The apparatus of claim 31, wherein the purge gas outlet includes a purge gas channel formed in the substrate support member, the channel extending about the perimeter of the substrate receiving surface.

33. The apparatus of claim 31, wherein the pump system outlet is disposed outwardly and above the purge gas system inlet.

34. The apparatus of claim 31, wherein the purge gas system is capable of delivering gas to the perimeter of the substrate receiving surface at a rate of from about 300 to 1500 sccm.

35. The apparatus of claim 31, wherein the pump system has a pump rate of from about 300 to about 1500 sccm.

36. The apparatus of claim 31, wherein the purge gas system includes a purge gas ring mounted on the substrate support member, and a purge gas channel formed between the purge gas ring and the substrate support member.

37. The apparatus of claim 31, further comprising a substrate alignment system.

38. The apparatus of claim 37, wherein the alignment system includes a plurality of alignment protrusions disposed on the substrate support member to align a substrate received on the substrate support member within the pocket.

* * * * *